United States Patent
Straka et al.

(10) Patent No.: US 12,155,139 B2
(45) Date of Patent: Nov. 26, 2024

(54) ELECTRICAL CONNECTOR

(71) Applicant: MYANT INC., Toronto (CA)

(72) Inventors: Adrian Straka, Toronto (CA); Michelle Zheng, Toronto (CA); Calvin Fook-Lam Kwok, Toronto (CA); Christopher Robin Leiphart, Toronto (CA); Tomohito Okamura, Tokyo (JP)

(73) Assignee: MYANT INC., Toronto (CA)

( * ) Notice: Subject to any disclaimer, the term of this patent is extended or adjusted under 35 U.S.C. 154(b) by 227 days.

(21) Appl. No.: 17/789,404

(22) PCT Filed: Dec. 23, 2020

(86) PCT No.: PCT/CA2020/051789
§ 371 (c)(1),
(2) Date: Jun. 27, 2022

(87) PCT Pub. No.: WO2021/127782
PCT Pub. Date: Jul. 1, 2021

(65) Prior Publication Data
US 2023/0045627 A1    Feb. 9, 2023

(30) Foreign Application Priority Data

Dec. 25, 2019  (JP) ................................ 2019-234674

(51) Int. Cl.
*H01R 12/78* (2011.01)
*H01R 12/61* (2011.01)
(Continued)

(52) U.S. Cl.
CPC ............ *H01R 12/78* (2013.01); *H01R 12/61* (2013.01); *H01R 12/777* (2013.01); *H01R 12/778* (2013.01); *H05K 1/038* (2013.01)

(58) Field of Classification Search
CPC ......... H01R 24/38; H01R 24/50; H01R 12/73
(Continued)

(56) References Cited

U.S. PATENT DOCUMENTS

| 7,318,749 B2* | 1/2008 | Li ........................ H01R 12/716 439/580 |
| 2004/0009702 A1* | 1/2004 | Potega .................. H01R 24/58 439/578 |

(Continued)

FOREIGN PATENT DOCUMENTS

| CA | 2233466 A1 | 2/1998 |
| CA | 2987139 A1 | 7/2018 |

(Continued)

OTHER PUBLICATIONS

Canadian Intellectual Property Office (CIPO), International Search Report and Written Opinion to PCT/CA2020/051789, Mar. 23, 2021.

(Continued)

*Primary Examiner* — Ross N Gushi
(74) *Attorney, Agent, or Firm* — Norton Rose Fulbright Canada LLP (57) ABSTRACT

An electrical connector is provided. The electrical connector is connected to the counterpart electrical connector. The electrical connector includes: an insulating housing having an annular portion; a first elastic member provided to the annular portion; and a second elastic member provided to the annular portion, wherein the first elastic member has a first region exposed on an inner surface of the annular portion and configured to contact a first member of the counterpart electrical connector, the second elastic member has a second region exposed on an outer surface of the annular portion and configured to contact a second member of the counterpart electrical connector, and the first elastic member and the first member are electrical contacts and/or (Continued)

the second elastic member and the second member are electrical contacts.

9 Claims, 9 Drawing Sheets

(51) Int. Cl.
*H01R 12/77* (2011.01)
*H05K 1/03* (2006.01)

(58) Field of Classification Search
USPC .......................................................... 439/37
See application file for complete search history.

(56) References Cited

U.S. PATENT DOCUMENTS

2016/0181729 A1    6/2016    Barth et al.
2017/0288338 A1   10/2017   Komoto

FOREIGN PATENT DOCUMENTS

| JP | 10134905 A | 5/1998 |
|----|------------|--------|
| JP | 2015018730 A1 | 1/2015 |
| WO | 2019135356 A1 | 7/2019 |

OTHER PUBLICATIONS

Japanese Patent Office, Notice of Reasons for Refusal issued to JP 2019-234674, Feb. 29, 2024.

\* cited by examiner

ELECTRICAL CONNECTOR

CROSS-REFERENCED TO RELATED APPLICATIONS

This application claims all benefit including priority to Japanese Patent Application No. 2019-234674, filed Dec. 25, 2019, and entitled "ELECTRICAL CONNECTOR"; the entire contents of which are hereby incorporated by reference herein.

FIELD

The present disclosure relates to electrical connectors.

BACKGROUND

A snap button type electrical connector pair is known. A technique to attach, to a textile substrate, a board for connecting a connector is also known.

SUMMARY

When an electrical connector is mated to its counterpart electrical connector, an electrical contact included in the electrical connector may come into contact with an unintended part of the counterpart electrical connector, which may cause deformation or damage of the electrical contact in some cases. This is addressed, at least in part, by some embodiments of an electrical connector disclosed herein.

According to an aspect, an electrical connector is provided. The electrical connector is connected to a counterpart electrical connector. The electrical connector includes an insulating housing having an annular portion. The electrical connector includes a first elastic member provided to the annular portion. The electrical connector includes a second elastic member provided to the annular portion. The first elastic member has a first region exposed on an inner surface of the annular portion and configured to contact a first member of the counterpart electrical connector. The second elastic member has a second region exposed on an outer surface of the annular portion and configured to contact a second member of the counterpart electrical connector. The first elastic member and the first member are electrical contacts and/or the second elastic member and the second member are electrical contacts.

In some embodiments, the first elastic member and the second elastic member each may include an elastically deformable bending portion.

In some embodiments, the bending portion of the first elastic member and the bending portion of the second elastic member may be provided in the annular portion.

In some embodiments, the first region may be configured to be engaged with or contact the first member.

In some embodiments, the second region may be configured to be engaged with or contact the second member.

In some embodiments, tops of the bending portions may be located at a lower position than a top of the annular portion.

In some embodiments, the first elastic member and the second elastic member may be provided at circumferential positions of the annular portion that are different from each other.

In some embodiments, the electrical connector may be configured to be fixed to a cloth in which a conductive pattern is formed.

In some embodiments, at least one of the first elastic member and the second elastic member may have a terminal portion having a surface to be in contact with the conductive pattern.

In some embodiments, the housing may further include a base having an insulating boss portion to be inserted into the cloth. One surface of the terminal portion may be configured to contact a surface of the base of the housing that has the boss portion. The other surface of the terminal portion may be configured to contact the cloth. A through-hole may be formed through the terminal portion from the one surface to the other surface. The boss portion may penetrate the through-hole.

In some embodiments, the electrical connector may further include an insulating plate for placing the cloth between the plate and the base of the housing.

In some embodiments, a through-hole for the boss portion to penetrate may be formed through the plate.

In some embodiments, a part of the boss portion that protrudes out of the through-hole of the plate may be fixed to the plate by thermal welding or thermocompression bonding.

In some embodiments, the electrical connector may further include the counterpart electrical connector.

Other features will become apparent from the drawings in conjunction with the following description.

BRIEF DESCRIPTION OF DRAWINGS

In the figures which illustrate example embodiments.

DETAILED DESCRIPTION

Aspects of various embodiments are described through reference to the drawings. Hereinafter, identical or similar portions in drawings are given identical reference numbers, and the same explanation is omitted in some cases.

Figure 1:
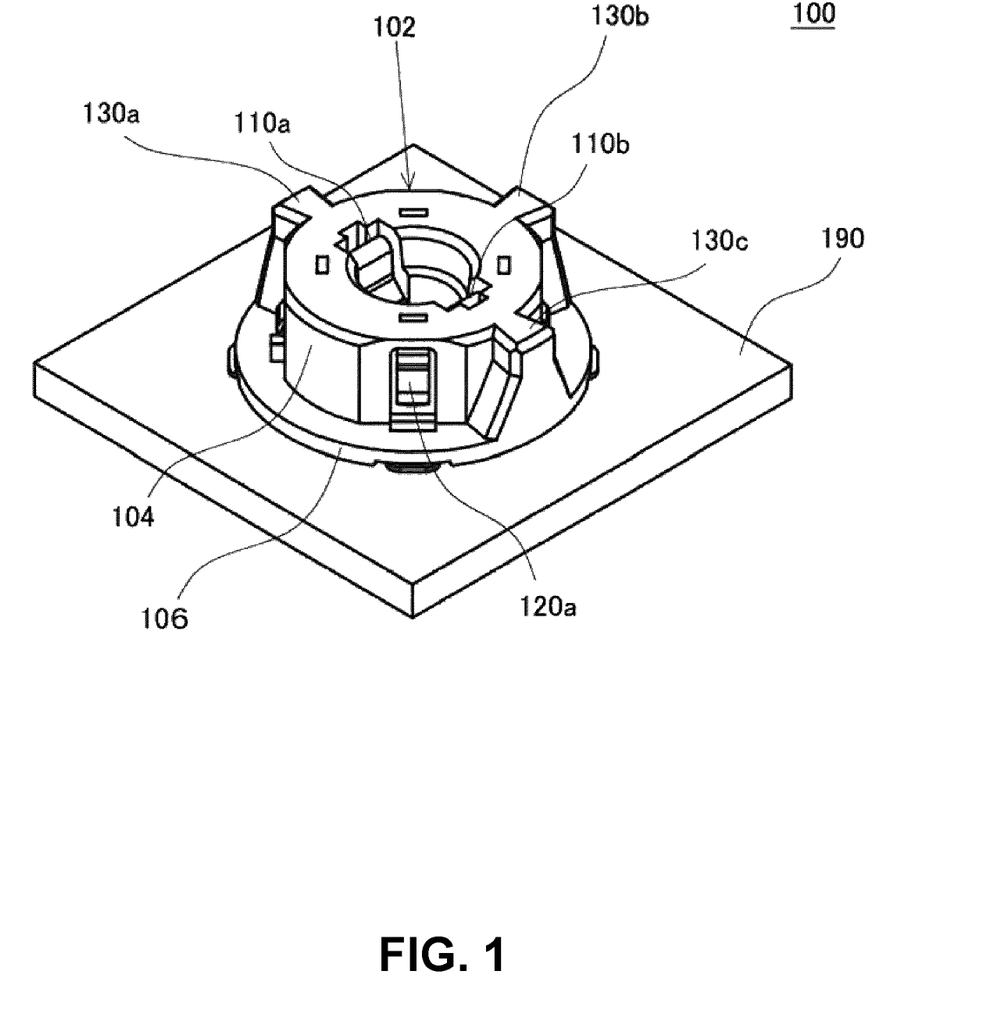
FIG. 1 is a perspective view of a receptacle, in accordance with an embodiment.
Figure 2:
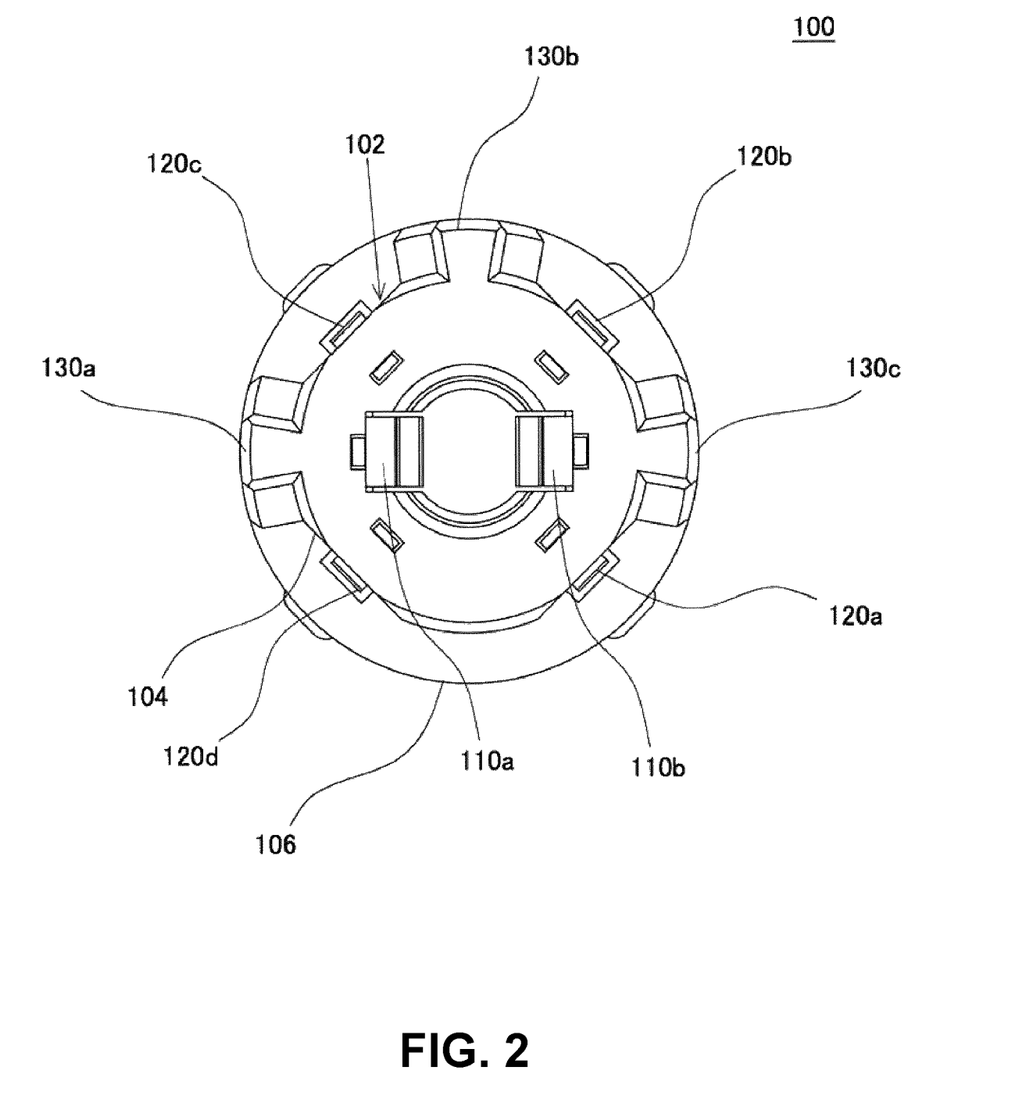
FIG. 2 is a top view of the receptacle of FIG. 1, in accordance with an embodiment.

FIG. 1 is a perspective view of a receptacle 100 according to one embodiment. FIG. 2 is a top view of the receptacle 100. FIGS. 1 and 2 show the receptacle 100 in a condition where it is attached to a cloth 190. A conductive pattern is formed in the cloth 190.

The receptacle 100 is one example of an electrical connector. The receptacle 100 includes a housing 102, an inner conductive elastic member 110a, an inner conductive elastic member 110b, an outer contact 120a, an outer contact 120b, an outer contact 120c and an outer contact 120d. The inner conductive elastic member 110a and the inner conductive elastic member 110b are collectively referred to as "inner conductive elastic member 110" in some cases. The outer contact 120a, the outer contact 120b, outer contact 120c and outer contact 120d are collectively referred to as "outer contact 120" in some cases.

A conductive pattern is formed in the cloth 190. The conductive pattern formed in the cloth 190 is electrically connected to the outer contact 120. The cloth 190 is provided on the lower surface side of a housing 102. As used in this embodiment, the terms indicating an up-and-down relationship such as "upper surface", "lower surface" and "up-and-down direction" represent orientations given under the assumption that one surface of the housing 102 that is closer to the cloth 190 is a lower surface and the opposite surface of the housing 102 is an upper surface. As used in this embodiment, the terms indicating the up-and-down relationship are irrelevant to the up-and-down relationship in the vertical direction.

The housing 102 is an insulating member. The housing 102 is formed of resin. The housing 102 includes an annular portion 104 and a base 106. The annular portion 104 has a key portion 130a, a key portion 130b and a key portion 130c. At least part of the base 106 is in contact with the cloth 190.

The inner conductive elastic member 110 and the outer contact 120 are fixed to the annular portion 104. The inner conductive elastic member 110 is one example of a "first elastic member". The outer contact 120 is one example of a "second elastic member".

As shown in FIG. 2, the inner conductive elastic member 110a, the inner conductive elastic member 110b, the outer contact 120a, the outer contact 120b, the outer contact 120c and the outer contact 120d are provided at circumferential positions of the annular portion 104 that are different from each other. In other words, none of the outer contacts 120 is located radially behind the inner conductive elastic member 110 as viewed from the center of the annular portion 104. This can make the annular portion 104 thinner.

Figure 3:
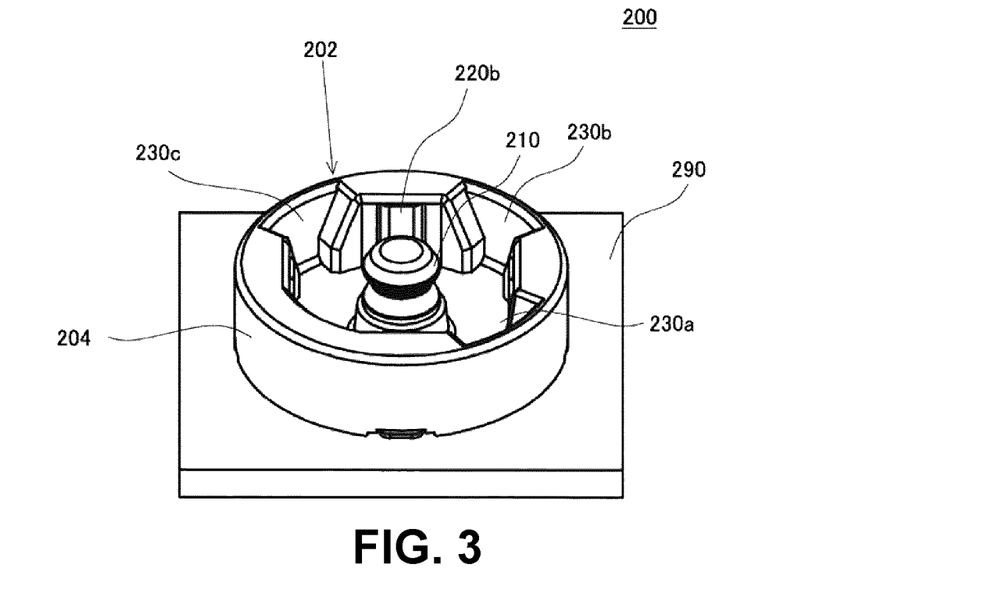
FIG. 3 shows a perspective view of a plug, in accordance with an embodiment.
Figure 4:
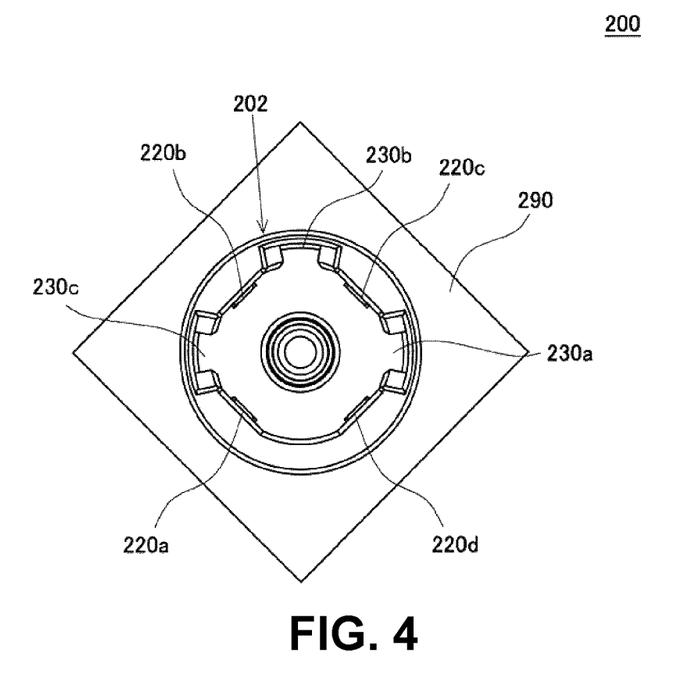
FIG. 4 is a top view of the plug of FIG. 2, in accordance with an embodiment.

FIG. 3 shows a perspective view of the plug 200. FIG. 4 is a top view of the plug 200. FIGS. 3 and 4 show the plug 200 in the condition where the it is attached to a cloth 290.

The receptacle 100 is connected to the plug 200. The plug 200 is one example of a counterpart electrical connector. The plug 200 includes a housing 202, an outer contact 220a, an outer contact 220b, an outer contact 220c and an outer contact 220d. The outer contact 220a, the outer contact 220b, the outer contact 220c and the outer contact 220d are collectively referred to as "outer contact 220" in some cases.

A conductive pattern is formed in the cloth 290. The conductive pattern formed in the cloth 290 is electrically connected to the outer contact 220.

The housing 202 is formed of resin. The housing 202 includes an inner pin 210 and an annular portion 204. The annular portion 204 surrounds the inner pin 210. The outer contact 220 is fixed to the annular portion 204. The inner pin 210 is one example of a "first member". The outer contact 220 is one example of a "second member".

The annular portion 204 has a key portion 230a, a key portion 230b and a key portion 230c. The bottom of the annular portion 204 is in contact with the cloth 290. At least the key portion 130a, the key portion 130b and the key portion 130c of the receptacle 100 are mated to the key portion 230a, the key portion 230b and the key portion 230c of the plug 200, respectively. In this way, the receptacle 100 and the plug 200 are mated to each other in a particular orientation.

Figure 5:
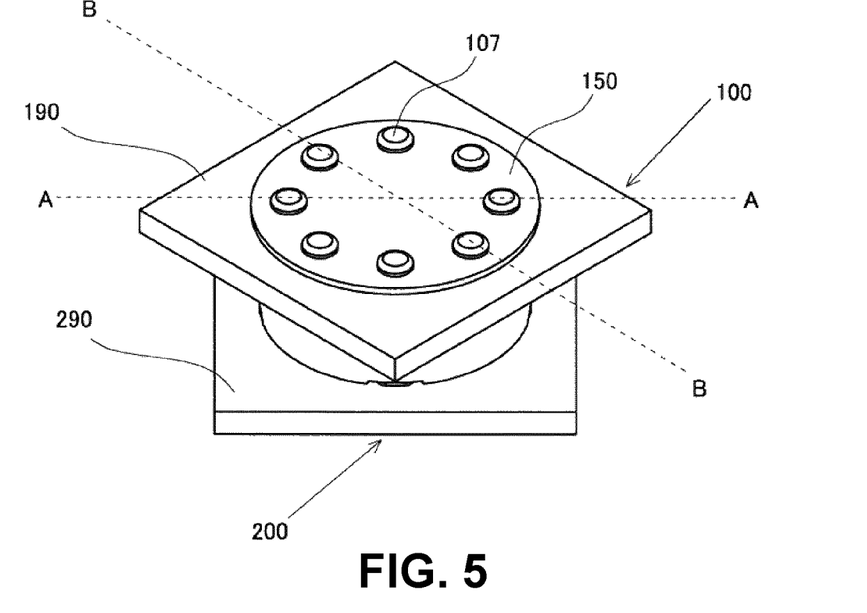
FIG. 5 is a perspective view of the receptacle of FIG. 1 and the plug of FIG. 3 in a mated condition, in accordance with an embodiment.
Figure 6:
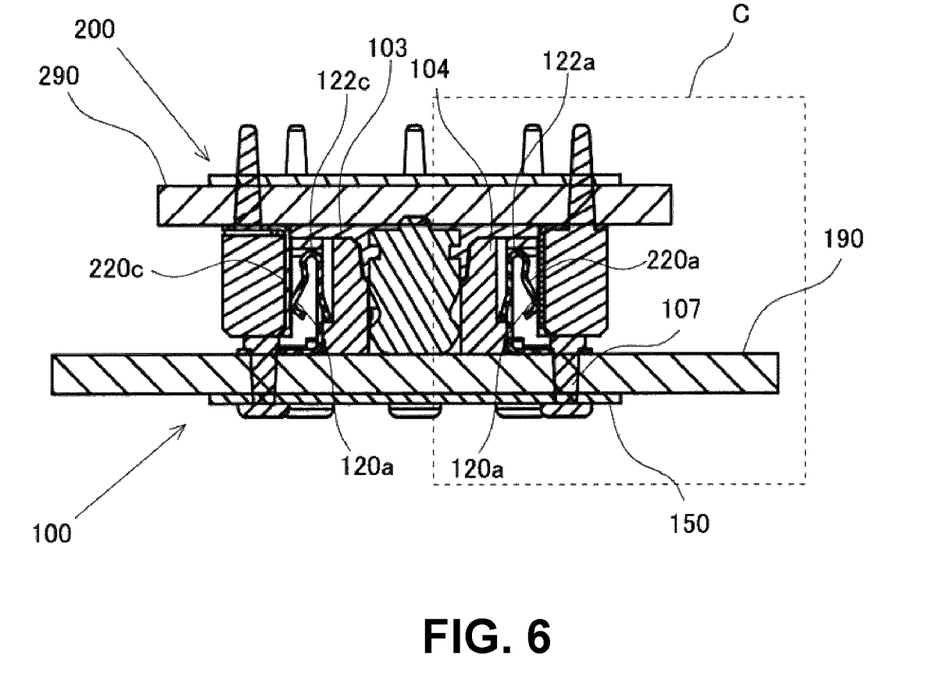
FIG. 6 is a cross-sectional view of the receptacle of FIG. 1 and the plug of FIG. 3, in a mated condition, in accordance with an embodiment.
Figure 7:
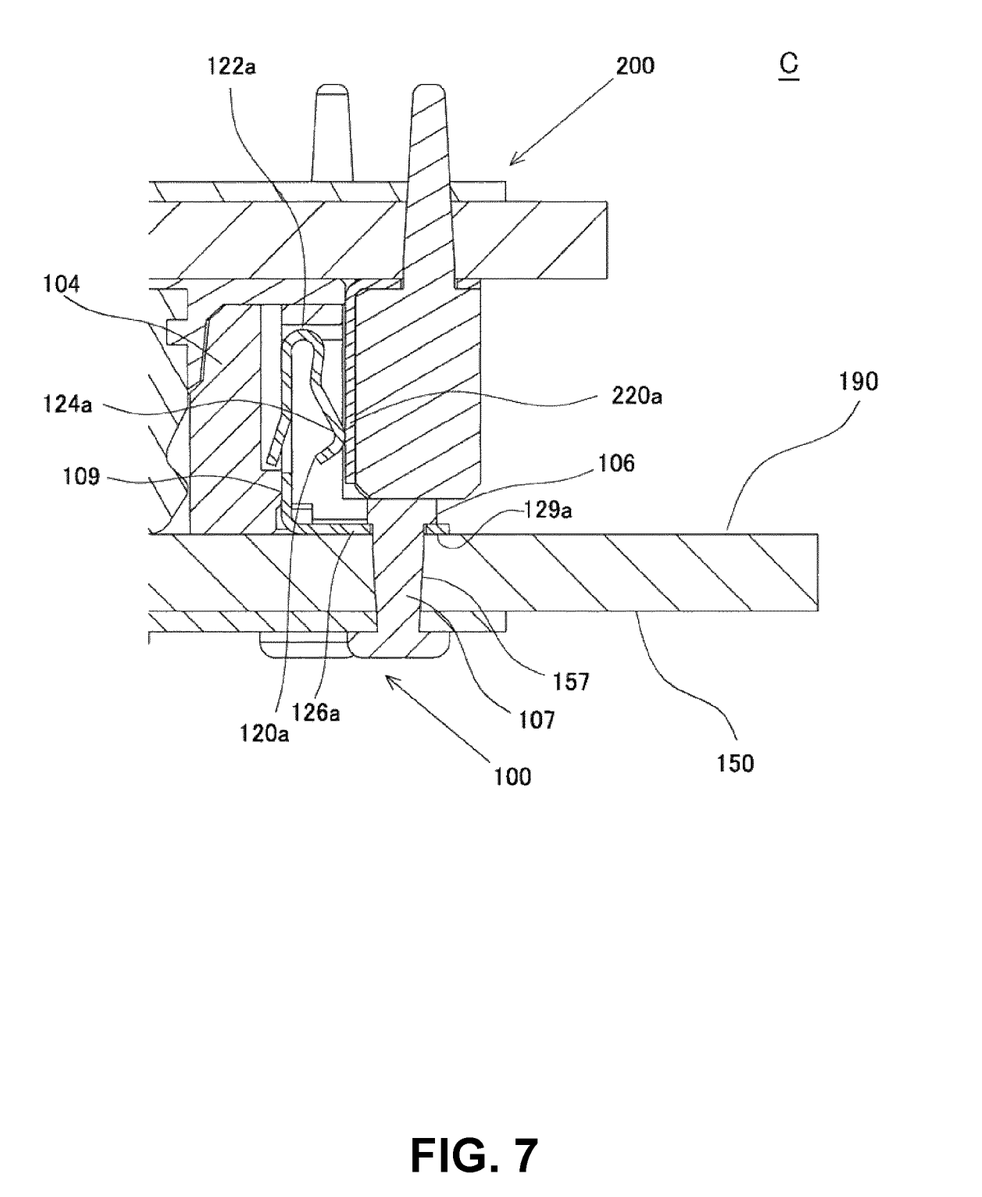
FIG. 7 is an enlarged view of a portion C of FIG. 6, in accordance with an embodiment.
Figure 8:
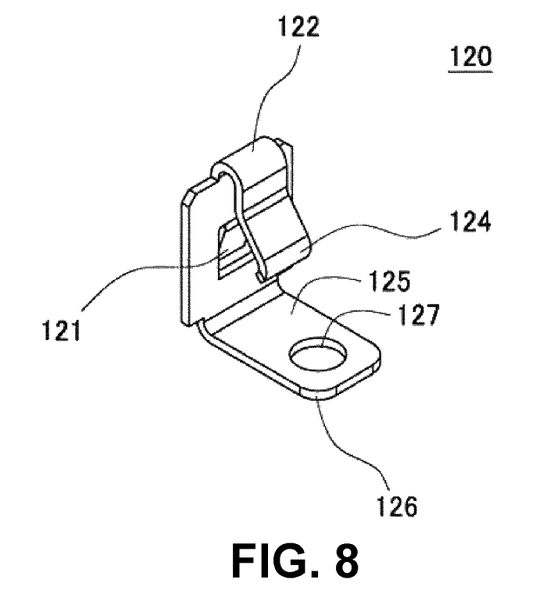
FIG. 8 is a perspective view of an outer contact, in accordance with an embodiment.
Figure 9:
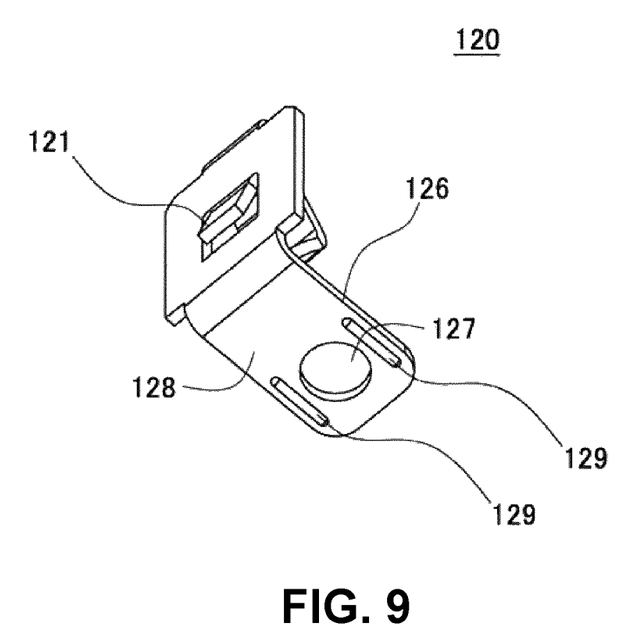
FIG. 9 is a perspective view of the outer contact of FIG. 8, in accordance with an embodiment.

FIG. 5 is a perspective view of the receptacle 100 and the plug 200 in a mated condition. FIG. 5 is a perspective view of the electrical connector assembly as viewed from the direction in which the bottom of the receptacle 100 can be seen. FIG. 6 is a cross-sectional view of the receptacle 100 and the plug 200 in a mated condition. FIG. 6 is a cross-sectional view obtained by cutting through the assembly in the up-and-down direction along an AA line in FIG. 5. FIG. 7 is an enlarged view of a portion C of FIG. 6. FIGS. 8 and 9 are perspective views of the outer contact 120.

First, the structure of the outer contact 120 is described with reference to FIGS. 8 and 9. The outer contact 120 is formed by processing a board-shaped metallic member. As shown in FIGS. 8 and 9, the outer contact 120 includes a terminal portion 126, a bending portion 122, a contact portion 124 and a fixing portion 121. The fixing portion 121 is engaged with a cutout formed on the annular portion 104 to fix the outer contact 120 to the annular portion 104. The terminal portion 126 has formed therethrough a throughhole 127 which penetrates from an upper surface 125 to a lower surface 128 of the terminal portion 126. The terminal portion 126 has a protrusion 129 which protrudes from the lower surface 128 of the terminal portion 126.

The outer contact 120 has a turned-back shape having the bending portion 122 as the vertex. In addition, the outer contact 120 has the contact portion 124 formed by the bending portion 122 of the metallic member. The contact portion 124 has a projecting shape formed by a bending portion of the metallic member. The contact portion 124 is one example of a "second region" which is exposed on an outer surface 109 of the annular portion 104 and configured to contact the outer contact 220.

In this embodiment, a label "a" is added to each of the components: the "terminal portion 126"; the "bending portion 122"; the "contact portion 124"; and the "fixing portion 121" that are included in the outer contact 120a for description in some cases. The same is applied to the outer contact 120b, the outer contact 120c and the outer contact 120d, that is, labels "b", "c" and "d" are added to each of the above-described components that are included in the respective outer contacts 120 for description in some cases.

As shown in FIGS. 6 and 7, the bending portion 122a is located lower than the top 103 of the housing 102. Further, the contact portion 124a is provided such that the contact portion 124a has a shape projecting toward the outside of the housing 102 and is exposed on the outer surface 109 of the annular portion 104. The contact portion 124a is located farther away from the center of the housing than the bending portion 122a. Accordingly, the outer contact 120a can be elastically deformed under force directed from the outside to the inside of the housing that is applied to the contact portion 124a. This allows contact of the contact portion 124a with the outer contact 220a of the plug 200 to be maintained.

Similarly, the bending portion 122c is located lower than the top 103 of the housing 102. Further, the contact portion 124c is provided such that the contact portion 124c has a shape projecting toward the outside of the housing 102 and is exposed on the outer surface 109 of the annular portion 104. The contact portion 124c is located farther away from the center of the housing than the bending portion 122c. Accordingly, the outer contact 120c can be elastically deformed under force directed from the outside to the inside of the housing that is applied to the contact portion 124c. This allows contact of the contact portion 124c with the outer contact 220c of the plug 200 to be maintained.

Similar to the outer contact 120a and the outer contact 120c, a bending portion 122b of the outer contact 120b and a bending portion 122d of the outer contact 120d are located lower than the top 103 of the housing 102, which is not shown in FIG. 6. Further, the contact portion 124b and the contact portion 124d are provided such that the contact portions 124b and 124d have a shape projecting toward the outside of the housing 102 and is exposed on the outer surface 109 of the annular portion 104. The outer contact 120b and the outer contact 120d can be elastically deformed under force directed from the outside to the inside of the housing that is applied respectively to the contact portion 124b and the contact portion 124d. This allows contact of the contact portion 124b with the outer contact 220b of the plug 200 and contact of the contact portion 124d with the outer contact 220d of the plug 200 to be maintained.

As described above, the bending portion 122 of the outer contact 120 is located lower then the top 103 of the housing 102. This can reduce contact of an unintended region of the plug 200 with the outer contact 120 when the receptacle 100 is mated to the plug 200, thereby allowing reduction in plastic deformation or damage of the outer contact 120 due to contact with an unintended region of the plug 200.

As shown in FIG. 7, the receptacle 100 is attached to the cloth 190 by placing the cloth 190 between the base 106 of the housing 102 and the insulating plate 150.

A boss portion 107 protrudes from the base 106 of the housing 102. The boss portion 107 is an insulating member to be inserted into the cloth 190. A through-hole 127a is formed through the terminal portion 126a of the outer contact 120a. In addition, a through-hole 157 is formed through the plate 150. The boss portion 107 passes through the through-hole 127a of the outer contact 120a, pierces the cloth 190 and passes through the through-hole 157, to protrude out of the plate 150. As will be described later, the boss portion 107 is fixed to the plate 150 by thermal welding or thermocompression bonding.

A conductive pattern is formed in the cloth 190. The outer contact 120a has a lower surface 128a to be in contact with the conductive pattern formed in the cloth 190. As described above, a protrusion 129a is formed on the lower surface 128a of the outer contact 120a. Accordingly, the protrusion 129a is pressed hard against the conductive pattern formed in the cloth 190. This can improve electrical connectivity between the conductive pattern formed in the cloth 190 and the outer contact 120a.

The boss portion 107 is provided at a position aligned with the through-hole 127 of the outer contact 120 other than the outer contact 120a, that is, the outer contact 120b, the outer contact 120c and the outer contact 120d, at the base 106 of the housing 102. In this manner, the housing 102 has the boss portion 107 in at least the area where the outer contact 120 is to be in contact with the cloth 190. The upper surface 125 of the terminal portion 126 of each outer contact 120 is to be in contact with a surface of the base 106 of the housing 102 that has the boss portion 107. In addition, the lower surface 128 of the terminal portion 126 of each outer contact 120 is to be in contact with the cloth 190. Each outer contact 120 has formed therein the through-hole 127 penetrating from the upper surface 125 to the lower surface 128, and the boss portion 107 penetrates the through-hole 127 and pierces the cloth 190.

Figure 10:
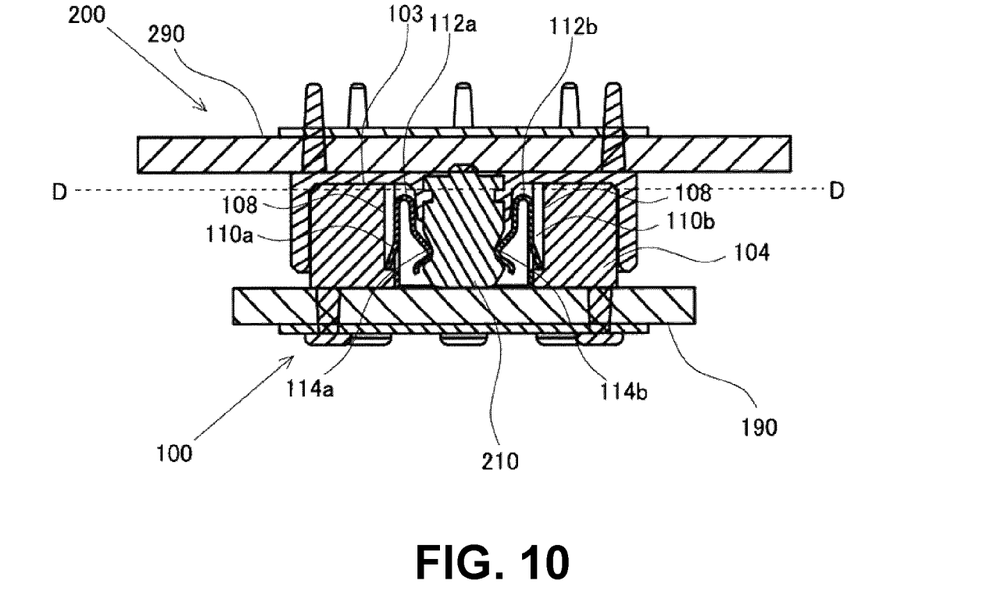
FIG. 10 is a cross-sectional view of the receptacle of FIG. 1 and the plug of FIG. 3 in a mated condition, in accordance with an embodiment.
Figure 11:
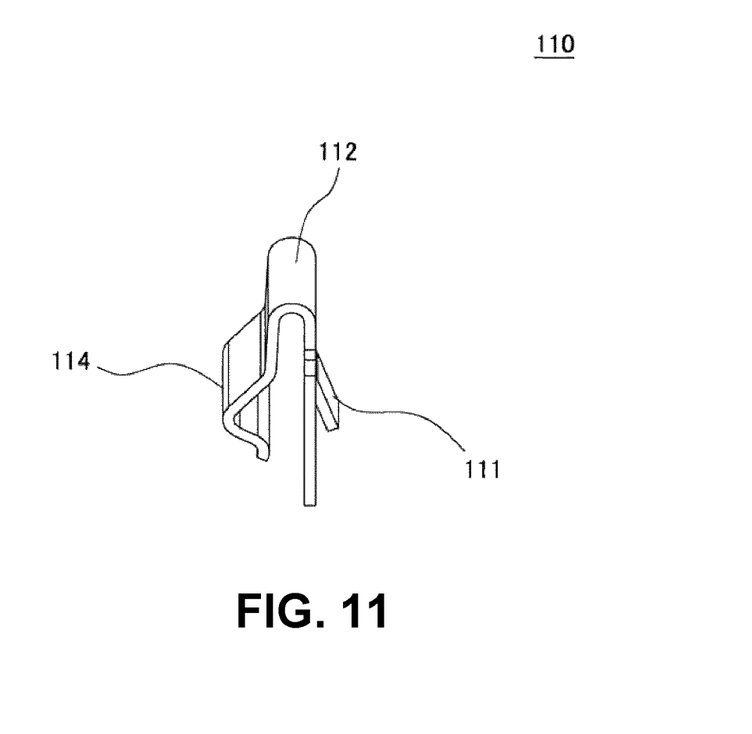
FIG. 11 is a perspective view of an inner conductive elastic member, in accordance with an embodiment.

FIG. 10 is a cross-sectional view of the receptacle 100 and the plug 200 in a mated condition. FIG. 10 is a cross-sectional view obtained by cutting through the assembly in the up-and-down direction along a BB line in FIG. 5. FIG. 11 is a perspective view of an inner conductive elastic member 110.

First, the structure of the inner conductive elastic member 110 is described with reference to FIG. 11. The inner conductive elastic member 110 is formed by processing a board-shaped metallic member. As shown in FIG. 11, the inner conductive elastic member 110 includes a bending portion 112, an engagement portion 114 and a fixing portion 111. The fixing portion 111 is engaged with a cutout formed on the inner side of the annular portion 104 to fix the inner conductive elastic member 110 to the annular portion 104.

The inner conductive elastic member 110 has a turned-back shape having the bending portion 112 as the vertex. In addition, the engagement portion 114 of the inner conductive elastic member 110 is formed by the bending portion 112 of the metallic member. The engagement portion 114 has a projecting shape. The engagement portion 114 is one example of the "first region" which is exposed on an inner surface 108 of the annular portion 104 and configured to contact the inner pin 210.

In this embodiment, a label "a" is added to each of the components: the "bending portion 112"; the "engagement portion 114"; and the "fixing portion 111" that are included in the inner conductive elastic member 110a for description in some cases. Similarly, a label "b" is added to each of the components: the "bending portion 112"; the "engagement portion 114"; and the "fixing portion 111" that are included in the inner conductive elastic member 110b for description in some cases.

As shown in FIG. 10, the engagement portion 114a of the inner conductive elastic member 110a is located closer to the center of the housing than the bending portion 112a. Accordingly, the inner conductive elastic member 110a can be elastically deformed under force directed from the inside to the outside of the housing that is applied to the engagement portion 114a. This causes the engagement portion 114a to be engaged with the inner pin 210 of the plug 200. Similarly, the engagement portion 114b of the inner conductive elastic member 110b is located closer to the center of the housing than the bending portion 112b. This allows the inner conductive elastic member 110b to elastically deform under force directed from the inside to the outside of the housing that is applied to the engagement portion 114b. As a result, the engagement portion 114b is engaged with the inner pin 210 of the plug 200.

As shown in FIG. 10, the bending portion 112 of the inner conductive elastic member 110 is located lower than the top 103 of the housing 102. This can reduce plastic deformation or damage of the inner conductive elastic member 110 due to contact of an unintended region of the plug 200 with the inner conductive elastic member 110 when the receptacle 100 is mated to the plug 200.

Figure 12:
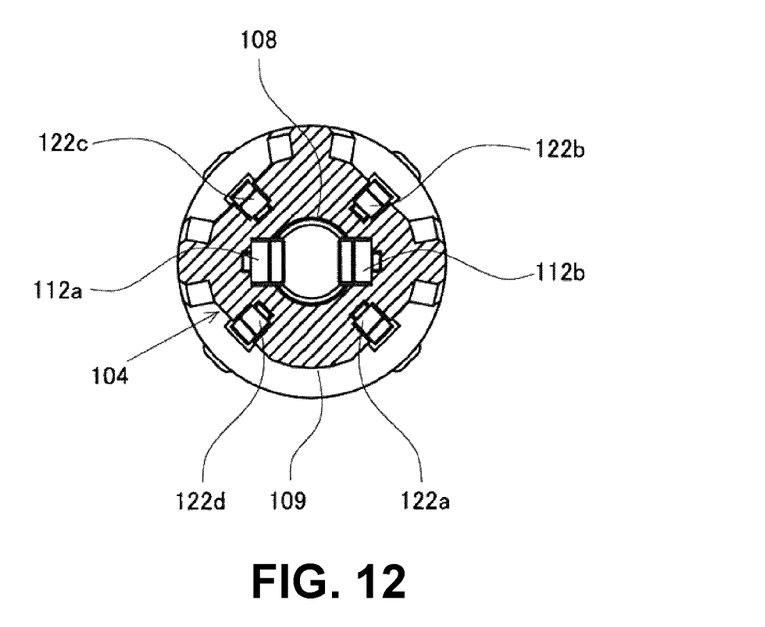
FIG. 12 is a horizontal sectional view of the receptacle of FIG. 1, in accordance with an embodiment.

FIG. 12 is a horizontal sectional view of the receptacle 100. FIG. 12 is a cross-sectional view obtained by cutting through the receptacle 100 in a direction orthogonal to the up-and-down direction along a DD line in FIG. 10.

The bending portion 112 of the inner conductive elastic member 110 is located farther away from the center of the housing than the inner surface 108 of the annular portion 104, that is, located inside the annular portion 104. Further, the bending portion 112 is located closer to the center of the housing than the outer surface 109 of the annular portion 104. In addition, the bending portion 122 of the outer contact 120 is located closer to the center of the housing than the outer surface 109 of the annular portion 104 and located farther away from the center of the housing than the inner surface 108 of the annular portion 104.

In this manner, the bending portion 112 of the inner conductive elastic member 110 and the bending portion 122 of the outer contact 120 are provided inside the annular portion 104. In other words, the bending portion 112 and the bending portion 122 are provided between the inner surface 108 and the outer surface 109 of the annular portion 104. This causes the bending portion 112 of the inner conductive elastic member 110 and the bending portion 122 of the outer contact 120 to be covered by the annular portion 104, thereby allowing reduction in plastic deformation or damage of the inner conductive elastic member 110 and the outer contact 120 due to contact with an unintended region of the plug 200 when the receptacle 100 is mated to the plug 200.

Figure 13:
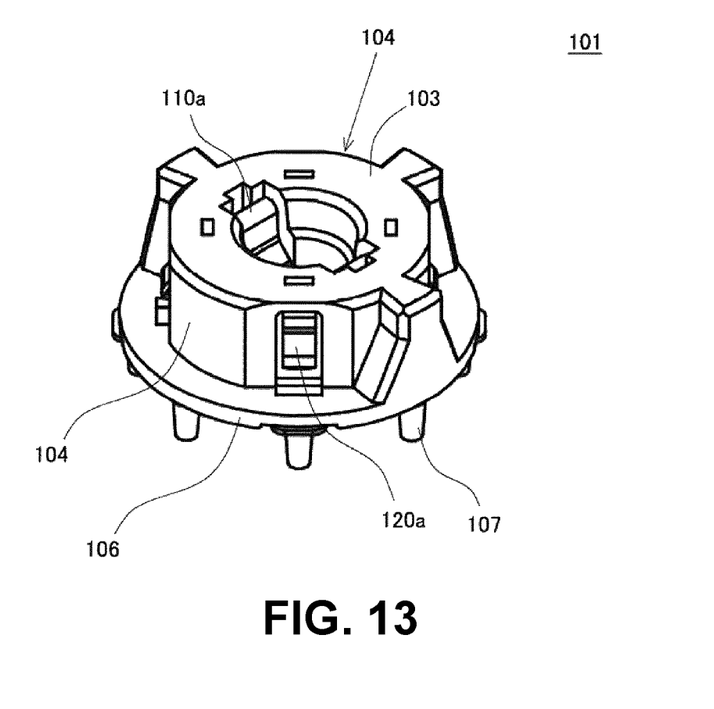
FIG. 13 is a perspective view of a receptacle main body, in accordance with an embodiment.
Figure 14:
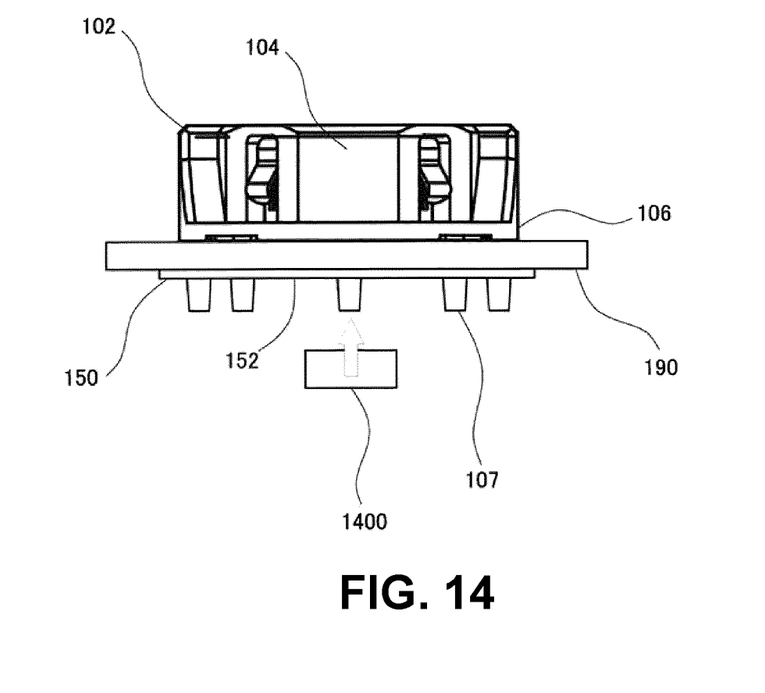
FIG. 14 is a lateral view showing the condition where a cloth and a plate are fitted to the receptacle main body of FIG. 13, in accordance with an embodiment.

FIG. 13 is a perspective view of a receptacle main body 101 alone. The receptacle main body 101 corresponds to the receptacle 100 without the plate 150, which is one of the components forming the receptacle 100. FIG. 14 is a lateral view showing the condition where a cloth 190 and a plate 150 are fitted to the receptacle main body 101.

As described above, a plurality of boss portions 107 each penetrate the through-hole 127 of the terminal portion 126 of the outer contact 120 to protrude from the base 106 of the housing 102 in the receptacle main body 101.

As shown in FIG. 14, when the cloth 190 and the plate 150 are fitted to the receptacle main body 101, a head portion of the boss portion 107 protrudes out of a lower surface 152 of the plate 150. Under this condition, a thermal plate 1400 is pressed against the head portion of the boss portion 107 protruding out of the plate 150. As a result, the head portion of the boss portion 107 melts by heat and adheres to the plate 150. In this manner, the boss portion 107 is fixed to the plate 150 by thermal welding of the portion protruding from the plate 150.

Alternatively, the head portion of the boss portion 107 may be fixed to the plate 150 through plastic deformation by heat. For example, the boss portion 107 may be fixed to the plate 150 through plastic deformation by thermocompression bonding of the portion protruding from the plate 150.

According to the embodiment described above, the outer contact 120 serves as an electrical contact, while the inner conductive elastic member 110 does not serve as an electrical contact and provides a function for mating the plug 200 to the receptacle 100. Alternatively, the inner conductive elastic member 110, besides the outer contact 120, may serve as an electrical contact. For example, an electrode to be electrically connected to an electrode pattern formed in the cloth 290 may be formed on the surface of the inner pin 210 of the plug 200 by insert molding or the like. Then, the inner conductive elastic member 110 of the receptacle 100 may be electrically connected to the conductive pattern by using the connection structure similar to that of the outer contact 120. In so doing, the inner pin 210 of the plug 200 may be formed by two electrodes insulated from each other to cause the inner conductive elastic member 110a and the inner conductive elastic member 110b to serve as two electrical contacts.

The cloth 190 may form a part of a garment, an undergarment, or the like. A conductive pattern may be formed in the cloth 190 by weaving conductive yarn into the cloth 190. The conductive pattern may be formed by adhesion to the cloth 190. For example, the conductive pattern may be formed on the cloth 190 by printing the pattern on the cloth 190 in conductive ink. Similar to the cloth 190, the cloth 290 may form a part of a garment, an undergarment, or the like, and a conductive pattern may also be formed. Using the electrical connectors, electrical signals or electrical power can be transmitted bilaterally between the cloth 190 and the cloth 290.

Figure 15:
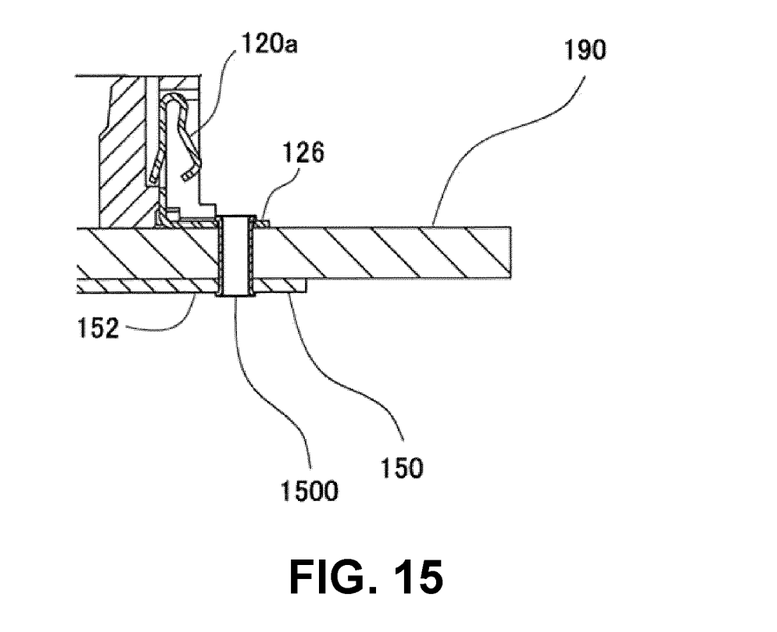
FIG. 15 shows a variation of a receptacle, in accordance with an embodiment.

FIG. 15 shows a cross section of a variation of the receptacle 100. FIG. 15 is a cross-sectional view of a portion in which the outer contact 120a and the cloth 190 are contact each other. Using an eyelet 1500, the outer contact 120a is fixed to the plate 150 and electrically connected to the conductive pattern formed in the cloth 190. For example, the outer contact 120a is fixed to the plate 150 by inserting eyelet 1500 through the through-hole 127 of the terminal portion 126 of the outer contact 120 and deforming, by a jig, a part of the eyelet 1500 that protrudes from the lower surface 152 of the plate 150. The other outer contacts 120 may be also fixed to the plate 150 with the eyelet 1500 in the similar way.

According to the receptacle 100 described above, electrodes such as the inner conductive elastic member 110 and the outer contact 120a are disposed independent of the housing 102 by using the housing 102 as an insulator. This can reduce deformation or damage due to contact of members of the receptacle 100 such as the electrical contact with an unintended region of the plug 200 when the plug 200 is mated to the receptacle 100, while allowing the receptacle 100 to have multiple electrodes serving as contacts. The connection structure of the above-described receptacle 100 is not necessarily limited to that of a receptacle, but electrical connectors having different connection structures are applicable. The connection structure of the above-described receptacle 100 can be applied to electrical connectors other than those attachable to a cloth.

As used herein, the term "cloth" is intended to include various textiles (e.g., whether formed by weaving, knitting, crocheting, knotting, tatting, felting, bonding, braiding, or the like). The connection structure of the above-described receptacle 100 can be applied to such various textiles.

Of course, the above described embodiments are intended to be illustrative only and in no way limiting. The described embodiments are susceptible to many modifications of form, arrangement of parts, details and order of operation. The disclosure is intended to encompass all such modification within its scope, as defined by the claims.

What is claimed is:

1. An electrical connector to be connected to a counterpart electrical connector, the electrical connector comprising:
   an insulating housing having an annular portion;
   a first elastic member provided to the annular portion; and
   a second elastic member provided to the annular portion,
   wherein the first elastic member has a first region exposed on an inner surface of the annular portion and configured to contact a first member of the counterpart electrical connector,
   the second elastic member has a second region exposed on an outer surface of the annular portion and configured to contact a second member of the counterpart electrical connector, and
   the first elastic member and the first member are electrical contacts and/or the second elastic member and the second member are electrical contacts,
   wherein the electrical connector is configured to be fixed to a cloth in which a conductive pattern is formed, and at least one of the first elastic member and the second elastic member has a terminal portion having a surface to be in contact with the conductive pattern, and wherein the housing further includes a base having an insulating boss portion to be inserted into the cloth.

2. The electrical connector according to claim 1, wherein the first elastic member and the second elastic member each include an elastically deformable bending portion, and the bending portion of the first elastic member and the bending portion of the second elastic member are provided in the annular portion.

3. The electrical connector according to claim 2, wherein the first region is configured to be engaged with or contact the first member; and the second region is configured to be engaged with or contact the second member.

4. The electrical connector according to claim 2, wherein tops of the bending portions of the first and second elastic members are located at a lower position than a top of the annular portion.

5. The electrical connector according to claim 1, wherein the first elastic member and the second elastic member are provided at circumferential positions of the annular portion that are different from each other.

6. The electrical connector according to claim 1, wherein one surface of the terminal portion is configured to contact a surface of the base of the housing that has the boss portion; another surface of the terminal portion is configured to contact the cloth; a through-hole is formed through the terminal portion from the one surface to the other surface; and the boss portion penetrates the through-hole.

7. The electrical connector according to claim 1, further comprising an insulating plate for placing the cloth between the plate and the base of the housing, wherein a through-hole for the boss portion to penetrate is formed through the plate.

8. The electrical connector according to claim 7, wherein a part of the boss portion which protrudes out of the through-hole of the plate is fixed to the plate by thermal welding or thermocompression bonding.

9. The electrical connector according to claim 1, further comprising the counterpart electrical connector.

* * * * *